United States Patent [19]

Brown

[11] Patent Number: 4,510,450

[45] Date of Patent: Apr. 9, 1985

[54] APPARATUS AND ASSAY METHOD FOR THE QUANTITATIVE DETERMINATION OF MINERAL CONTENT IN BONE

[75] Inventor: Charles E. Brown, Hubertus, Wis.

[73] Assignee: The Medical College of Wisconsin, Inc., Milwaukee, Wis.

[21] Appl. No.: 426,147

[22] Filed: Sep. 28, 1982

[51] Int. Cl.³ .............................................. G01R 33/08
[52] U.S. Cl. .................................... 324/321; 324/308
[58] Field of Search ................ 324/300, 318, 321, 308

[56] References Cited

U.S. PATENT DOCUMENTS

| | | | |
|---|---|---|---|
| 3,329,890 | 7/1967 | Kingston | 324/308 |
| 3,427,532 | 2/1969 | Nelson | 324/308 |
| 4,254,373 | 3/1981 | Lippmaa et al. | 324/321 |
| 4,275,350 | 6/1981 | Hill et al. | 324/321 |

FOREIGN PATENT DOCUMENTS

| | | | |
|---|---|---|---|
| 170734 | 9/1962 | U.S.S.R. | 324/308 |
| 175715 | 3/1964 | U.S.S.R. | 324/308 |
| 811125 | 11/1978 | U.S.S.R. | 324/308 |

OTHER PUBLICATIONS

"Determination of Magnetic Moments in Solution by NMR Spectrometry", R. Engel et al., Analytical Chemistry, vol. 45, #2, Feb. 1973, pp. 367-369.

"Purification, Composition & ³¹P NMR Spectroscopic Properties of a Noncollageneous Phoprotien Isolated from Chicken Bone Matrix", Lee et al., Calcification Tissue International, 1981, 33 (4), pp. 385-394.

"High Speed Spinner for Magic Angle Spinning NMR", Van Dijk et al., Institute of Physics, Scientific Instrs., vol. 13, #12, Dec. 1980.

High Resolution NMR Spectroscopy, Emsleg et al., pp. 1052—1078.

"NMR Probe for Combined Hemonuclear Multiple Pulse Decoupling and Magic Angle Spinning", by R. G. Pembleton et al. in *Rev. Sci. Instrum.*, vol. 48, No. 10, pp. 1286-1289, (1977).

"High-Resolution Variable-Temperature ³¹P NMR of Solid Calcium Phosphates", by W. P. Rothwell et al. in *J. Am. Chem. Soc.*, 102(8):2637-2643, (1980).

"Magic Angle Sample Spinning in Inhomogeneously Broadened Biological Systems", by J. Herzfeld et al. in *Phil. Trans. R. Soc. Land.*, B 289, 459-469, (1980).

"High-Speed Rotors for Nuclear Magnetic Resonance Studies on Solids," Andrew, E. R., Farnell, L. F., Firth, M., Gledhill, T. D., and Roberts, I., *J. Magn. Reson.*, 1, 27, 1969.

"NMR Probe for Combined Homonuclear Multiple Pulse Decoupling and Magic Angle Spinning", Pembleton, R. G., Ryan, L. M., and Gerstein, B. C., *Rev. Sci. Instrum.*, 48, 1286, 1977.

"A High-Speed Magic Angle Spinner", Zilm, K. W., Alderman, D. W., and Grant, D. M., *J. Magn. Reson.*, 30, 563, 1978.

"A Simple 'Magic-Angle' Spinning Apparatus for Routine Use in NMR Spectroscopy of Solids", Fyfe, C. A., Mossbruger, H., and Yannoni, C. S., *J. Magn. Reson.*, 36, 61, 1979.

"Spinning Apparatus for Nuclear Magnetic Resonance Spectrometers, and Spectrometer Incorporating this Spinning Apparatus", Fyfe, C. A., Mossbruger, H. G., and Yannoni, C., *Chemical Abstracts*, vol. 93, 1980, 93: 849644.

"High—Resolution Proton NMR in Solids with Multiple—Pulse Sequences and Magic—Angle Sample Spinning at 270 MHz", Scheler, G., Haubenreisser, U., and Rosenberger, H., *J. Magn. Reson.*, 44, 134, 1981.

*Primary Examiner*—Stewart J. Levy
*Attorney, Agent, or Firm*—Quarles & Brady

[57] ABSTRACT

An assay method for the quantitative determination of the mineral content of bone comprises using proton decoupling and magic angle sample spinning techniques to record well resolved ³¹P nuclear magnetic resonance spectra of unfractionated bone biopsy samples and characterizing the differences in mineral identity and content from those of normal bone. A rotor for performing the assay includes a compartment for the sample to be assayed, and a separate compartment for a reference material.

4 Claims, 4 Drawing Figures

APPARATUS AND ASSAY METHOD FOR THE QUANTITATIVE DETERMINATION OF MINERAL CONTENT IN BONE

FIELD OF THE INVENTION

The present invention relates to an apparatus and a method for the assay of minerals in bone. More particularly, it relates to a novel rotor for a nuclear magnetic resonance (NMR) apparatus and to a method of using that apparatus in the rapid assay of the mineral content of unfractionated bone. This novel rotor and method are useful in the clinical diagnosis of osteodystrophy.

BACKGROUND OF THE INVENTION

In the human body two hormones, parathormone and calcitonin, along with vitamin D have major roles in controlling the metabolism of calcium ($Ca^{++}$) and phosphate (Pi). Binding of parathormone to kidney cells yields among other things increased renal tubular reabsorption of $Ca^{++}$ and $Mg^{++}$, and enhanced excretion of Pi. The rates of renal gluconeogenesis and renal respiration are increased and hydroxylation of vitamin D to its active form (1,25-dihydroxy-vitamin D) is increased. In bones, parathormone inhibits collagen synthesis in active osteoblasts, increases osteocytic and osteoclastic osteolysis and increases the rate of maturation of osteoblasts and osteoclasts. There is increased mobilization of $Ca^{++}$ from bone and increased transport of $Ca^{++}$ across the intestine, accompanied by elevation of plasma $Ca^{++}$. Calcitonin reduces bone resorption, perhaps by inhibiting osteocytes and osteoclasts. This is accompanied by hypocalcemia and hypophosphatemia. Enhanced excretion of Pi may be a secondary response to alterations in plasma $Ca^{++}$. Secretion of parathormone is reduced and of calcitonin is increased in response to elevated $Ca^{++}$ in the circulation.

In the presence of calcitonin, $Ca^{++}$ and Pi are deposited in bone. The exact identities of the intermediates involved in the early steps of mineral deposition are still somewhat unsettled. It appears that brushite, $CaHPO_4.2H_2O$, is deposited first but then redissolves and is converted to amorphous calcium phosphate, a noncrystalline association of ions. This subsequently is believed to yield octacalcium phosphate, $Ca_8(HPO_4)_2(PO_4)_4.5H_2O$, which in turn converts to hydroxyapatite, $Ca_{10}(OH)_2(PO_4)_6$, the least soluble mineral of the group.

Several pathological conditions in which bone mineralization is deficient have been observed. These can arise from a number of conditions including, for example, abnormalities in hormonal regulation, renal cortical damage and dietary $Ca^{++}$ and phosphate deprivation. Two specific examples are given for illustration.

a. Osteoporosis

Osteoporosis is characterized by reduced mineral content of bone, especially trabecular bone, and is particularly prevalent in postmenopausal women. The underlying causes of osteoporosis in the female appear first to arise at about the age of 30-40 years with reduced secretion of calcitonin. This is accompanied by hypocalcemia and subsequent elevation of parathormone. The 1 alpha-hydroxylase activity of the kidney becomes elevated with a probable resulting increase in "remodeling" of mineral deposits, especially in trabecular bone. The skeletal complications of osteoporosis become apparent after the secretion of estrogen begins to decrease (i.e. 40-50 years of age). The metabolism of vitamin D appears to be reduced when the estrogen levels are lower, and the intestinal absorption of calcium is affected. It would appear that the reduced intestinal absorption of calcium places an increased demand on the skeletal system, which in time yields reduced mineral deposits in trabecular bone. This results, for example, in an increased incidence of fractures of the hip and vertebrae. Similar demineralization also can arise from hyperparathyroidism and chronic renal insufficiency.

b. X-linked hypophosphatemia

X-linked hypophosphatemia is the most common form of vitamin D-resistant rickets. Human patients with this disease have reduced renal tubular reabsorption of phosphate, low plasma phosphate and resistance to 1,25-dihydroxy-vitamin D administration. These patients also exhibit osteomalacic bone disease (i.e. softening of the bone due to impaired mineralization with excess accumulation of osteoid).

There is at the present time a clinical need for a rapid assay of mineral content of bone samples. Procedures such as scanning electron microscopy and X-ray crystallography have been used experimentally, but these techniques are cumbersome and time-consuming to perform. Furthermore, the results from these two techniques have not been in full agreement. Wet chemical techniques of bone analysis also have serious limitations. Ashing and extraction normally are prerequisites to elemental analysis, and these can result in incomplete recovery of individual components. Furthermore, total phosphate analyses are seriously affected by procedures used routinely in the clinical setting to treat patients. Thus the results of phosphate analyses do not necessarily yield a reliable indication of variations in bone mineralization. A more reliable approach would be to identify and quantify mineral forms in unfractionated bone biopsy samples.

SUMMARY OF THE INVENTION

It is the general object of the present invention to disclose an apparatus and an assay method for identifying and quantifying mineral forms in unfractionated bone.

The apparatus of the present invention is a novel NMR rotor which has both a compartment for a sample to be assayed and a separate compartment for containing a reference material.

The assay method of the present invention for identifying and quantifying mineral forms in unfractionated bone comprises (a) taking biopsy samples of unfractionated bone, (b) using magic angle sample spinning and dipolar proton decoupling (NMR) techniques to record well resolved $^{31}P$ NMR spectra of the unfractionated bone biopsy sample, and (c) comparing the qualitative and quantitative spectral results with those from "normal" bone samples to ascertain whether a pathological condition exists and to determine whether the condition involves a difference in mineral structure, mineral content or both.

In a preferred embodiment, the unfractionated bone biopsy samples are placed in the sample compartment of the rotor of the present invention and a reference sample (e.g. $KPF_6$) which permits quantitative measurement of mineral content is in its own separate compartment. The $^{31}P$ NMR spectra are then recorded (a) with neither magic angle sample spinning nor dipolar proton decoupling, (b) with magic angle sample spinning only and (c) with both magic angle sample spinning and dipolar proton decoupling. Soluble cytosolic phosphorylated intermediates, hydroxyapatite and protonated phosphate minerals such as brushite and octacalcium phosphate are thereby distinguished and quantified.

The inventive method thus provides clinically useful information about mineralization of bone that previously could not be obtained without labor-intensive fractionation and subsequent assays.

DESCRIPTION OF THE PREFERRED EMBODIMENT

Figure 1:
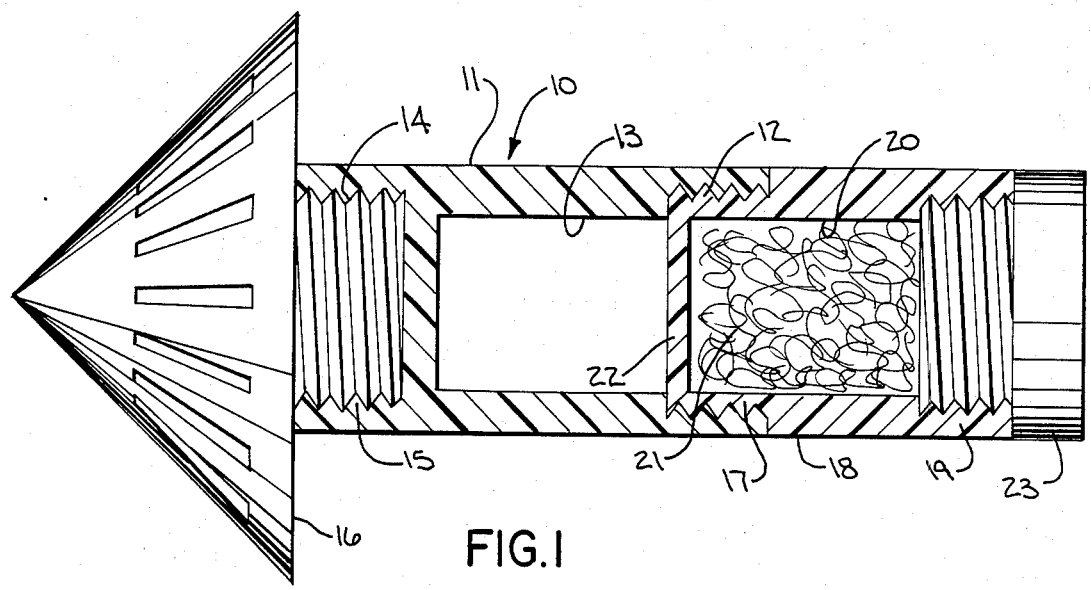
FIG. 1 is a perspective view, partially in section, of a preferred embodiment of the novel rotor of the present invention.

In the preferred embodiment of the present invention, an unfractionated bone biopsy sample is placed in a sample compartment of a novel rotor which has a second separate compartment which contains a reference material (e.g. $KPF_6$). Well resolved $^{31}P$ NMR spectra of unfractionated bone biopsy samples are then recorded to identify and quantify the mineral form(s) present in the biopsy sample. The results obtained are compared to those obtained from normal controls thus providing a rapid assay of the mineral content of the unfractionated bone which can be useful in making a medical diagnosis of the patient's condition.

The following test procedures are employed in the inventive method.

Solid State NMR Spectroscopy

The frequency of resonance of a nucleus depends on the strength of the external magnetic field and on the environment of the nucleus. Each nucleus of a particular isotope within a molecule, such as $^{31}P$, will resonate at a slightly different frequency from the others depending on the functional group of which it is a part. This "shielding" of the nucleus from the external magnetic field that gives rise to these differences in resonance frequency is dependent upon not only the identity of the functional group but also on the orientation of the functional group and of neighboring functional groups and molecules. In the gaseous and liquid states these differences in environment are averaged by rapid tumbling so that only an average frequency of resonance is observed that is centered at the frequency of resonance characteristic of that functional group. In the solid state, rapid motion is not possible or is not isotropic or both. Therefore, an array of resonances is observed corresponding to all the orientations of the functional group and of its neighboring molecules. In addition to the frequency of resonance, the relaxation rate of the excited nucleus from the high energy to the low energy level also is dependent upon the orientation and distance of other nuclei. This dependence of relaxation rate is the result of dipolar coupling with the magnetic moments of these other nuclei, which produce small fluctuations in the observed external magnetic field. In the gaseous and liquid states these dipolar interactions are modulated by the rapid, isotropic rotational and translational motion of the molecules. In the solid state the interactions are not modulated by isotropic motion, and, since the dipolar fields are the result of a specific orientation of the dipoles with respect to the applied field, the dipolar broadening is much larger. In the solid state these two effects of chemical shift anisotropy and dipolar broadening produce line widths measured in kilohertz. By comparison, the line widths of resonances in liquids are on the order of 0.1 to 1 Hz. Thus, the primary concern of the NMR spectroscopist who wishes to study nuclei in solids is to preferentially reduce the chemical shift anisotropies or the dipolar broadening or both in such a manner as to resolve the very broad "powder pattern" to an understandable spectrum analogous to that of liquids. These techniques are well developed and equipment is commercially available for these experiments.

a. Enhancement of Resolution and Sensitivity

Magic angle sample spinning is used to reduce the line broadening from chemical shift anisotropy. High-power proton decoupling is used to reduce dipolar broadening. Cross polarization can be used under certain circumstances to reduce the time required to obtain a spectrum with acceptable signal-to-noise. These techniques can be used together to produce well resolved spectra or can be used separately to distinguish among the various mechanisms of line broadening.

Magic Angle Sample Spinning

It can be demonstrated that many parts of the Hamiltonian for a solid spinning at the magic angle (54° 44' from the magnetic field) are identical to those for the liquid phase. Thus, when a solid sample is spun at this angle the orientation effects that cause variations in the chemical shift are averaged to much the same extent as they are from rapid tumbling in the liquid. The "liquid-like limit" is approximated when the solid sample is spun at a rotation frequency greater than the line width of the powder pattern. Since these lines are measured in kilohertz, the main technical requirements associated with this technique are to use a rotor that is capable of withstanding the required high rotation frequency of 1–10 KHz and to use a stator that is capable of keeping the axis of rotation of this spinning rotor as close to the magic angle as possible. When it is not possible to spin the sample rapidly enough to completely average the shielding tensors to a single isotropic value, spinning sidebands at multiples of the frequency of sample spinning are observed.

Dipolar Proton Decoupling

In principle, observation of $^{31}P$ in the solid phase should require decoupling of every other nucleus in the sample, but in practice one need worry only about coupling of $^1H$ and possibly $^{31}P$ nuclei because the natural abundance of other nuclei with magnetic moments is small. Dipolar broadening of $^{31}P$ nuclei by the more abundant $^1H$ nuclei can be almost totally eliminated simply by measuring a free induction decay in the presence of a decoupling field at the frequency of resonance of the protons. This generally requires about 200 watts of decoupling power.

Cross Polarization

The cross polarization experiment establishes population distributions of $^1H$ and $^{31}P$ nuclei, which interact with each other and thereby change their respective Boltzman distributions. This maximizes the entropy of the system while maintaining the total energy constant. The experiment is performed by administering a pi/2 pulse to the protons along the Y axis in the rotating frame followed by a long pulse along the X axis in the rotating frame. During this long pulse to the protons, the $^{31}P$ nuclei are pulsed for a time to establish $^1H$-$^{31}P$ contact and then the free induction decay of the $^{31}P$ nuclei is recorded. These $^{31}P$ pulses are repeated as necessary to deplete the polarization of the protons while increasing the sensitivity to the $^{31}P$ nuclei. The time between pulses no longer has a connection to the relaxation time of the $^{31}P$ nuclei; instead it is determined by the relaxation time of the protons. Cross polarization yields the same qualitative spectral results, but with a six-fold savings in time that results from being able to pulse more rapidly. The reason for this savings in time is that the $^{31}P$ nuclei must re-establish thermal equilibrium between pulses in the free induction decay experiment while the more rapidly relaxing $^1H$ nuclei must achieve thermal equilibrium in the cross polarization experiment.

Combination of Magic Angle Sample Spinning, Dipolar Proton Decoupling and Cross Polarization For polycrystalline or amorphous solids it is necessary to reduce line broadening from chemical shift anisotropy with magic angle sample spinning and simultaneously to reduce dipolar coupling. Cross polarization is an important tool for increasing the sensitivity when spectra of $^{13}C$ in solids are recorded, but is not as important for detection of $^{31}P$ in solids. Since the natural abundance of $^{31}P$ is 100% and NMR is quite sensitive to this nucleus, spectra of $^{31}P$ in solids can be recorded with simple dipolar decoupling without the increased sensitivity that cross polarization can produce. This also avoids artifacts in quantitative measurements that can be produced by cross polarization. If the mix pulse in the cross polarization sequence is not sufficiently long, the signals from the protonated phosphate minerals (i.e. brushite and octacalcium phosphate) will be artifactually enhanced in intensity relative to that of hydroxyapatite.

NMR Spectroscopy of Phosphorus

The utility of any spectral technique is related directly to the ease of obtaining spectra and to the ease of interpretation of spectra. The isotopic abundance of $^{31}P$ is 100%, and NMR is inherently quite sensitive to this nucleus. Therefore the sensitivity to "unenriched" phosphorus-containing samples is very good as compared for example to $^{13}C$ whose natural abundance is only 1.1%. In addition, the $^{31}P$ nucleus has a spin of $\frac{1}{2}$ and a chemical shift range of ca 700 ppm. Thus solid organo-phosphorus compounds yield spectra with narrow, well resolved lines in most cases.

With mixtures of phosphate minerals, one is confronted by the difficulty that all biologically important phosphates yield $^{31}P$ NMR peaks in a very narrow chemical shift range. Thus resolution of individual isotropic peaks in $^{31}P$ NMR spectra of bone would be very difficult. However, the anisotropy of $^{31}P$ shielding tensors of protonated phosphate minerals is greater than that of hydroxyapatite. Thus the protonated phosphate minerals can be distinguished from hydroxyapatite on the basis of the number of detected spinning sidebands. Furthermore, hydroxyapatite in bone yields a narrow peak in the absence of dipolar proton decoupling, whereas the protonated phosphate minerals yield very broad lines under the same conditions.

EXPERIMENTAL TECHNIQUES a. Preparation of Samples

Fresh, unfractionated bone biopsy material taken by conventional techniques is placed in the magic angle sample spinning rotor of the present invention, and the $^{31}P$ NMR spectra are recorded. Excess fluid such as blood and lymph may need to be removed from some samples by prior centrifugation over a supporting porous frit, but even this minor preparative step is not likely to be required in most cases.

b. Design of the Sample Rotor

Figure 3:
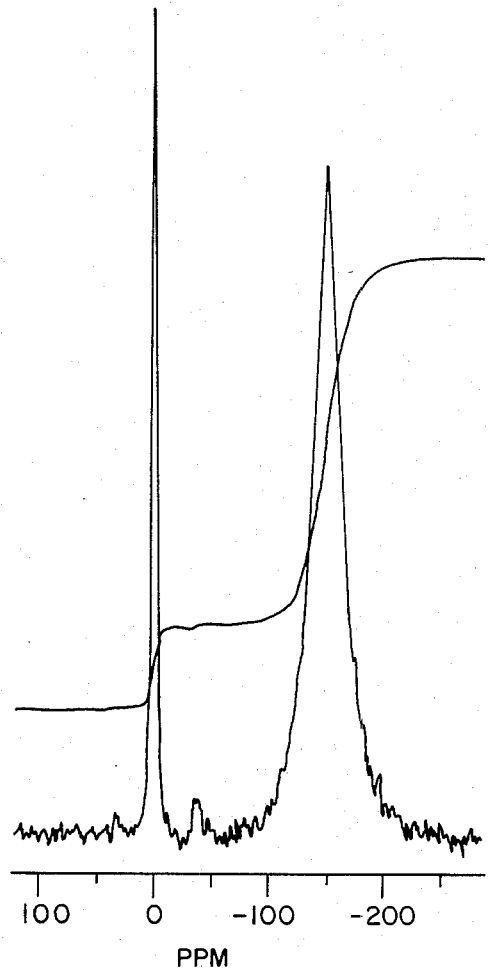
FIG. 3 is a proton decoupled, magic angle sample spinning $^{31}P$ NMR spectrum of unfractionated bone and a reference material ($KPF_6$)

In order for the assay results to be quantitative a reference material must be located in the sample rotor that yields a peak of known intensity in a region of the spectrum that does not interfere with the $^{31}P$ chemical shift range of the phosphate-containing minerals. Furthermore, this peak intensity should be independent of proton decoupling and of the frequency of magic angle sample spinning (see below). These requirements are met very well by potassium hexafluorophosphate, $KPF_6$, which resonates approximately 150 ppm upfield of the phosphate-containing minerals (FIG. 3). This peak is observed even when the sample rotor is stationary.

The $KPF_6$ must reside within the receiver coil at the same time as the spectrum of bone is being recorded. This may be accomplished simply by mixing a known amount of $KPF_6$ with the bone sample, but such a procedure experiences difficulties. The orientation of the $KPF_6$ relative to the receiver coil varies from sample to sample, thereby reducing reproducibility, and possible error in weighing and transferring the powdered $KPF_6$ is introduced. Furthermore, the $KPF_6$ contaminates the biopsy sample. An alternative approach is to deposit solid $KPF_6$ onto the inner surface of the rotor, but this experiences the difficulty that the reference $KPF_6$ will be lost with time when samples are scraped out of the rotor.

Figure 2:
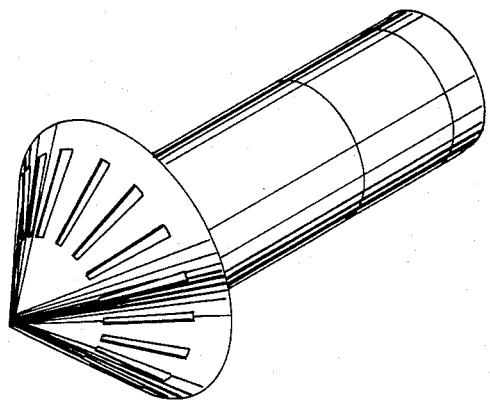
FIG. 2 is an elevational view of the rotor of FIG. 1.

I have discovered that optimum results are obtained with the rotor 10 of FIGS. 1 and 2. The rotor 10 has a cylindrical main body 11 which is open at one end 12 and has an internal sample compartment 13 into which a biopsy sample of unfractionated bone can be packed. The other end 14 of the main body 11 which may be opened or closed is threaded to receive a complementary threaded end 15 of a finned rotor cap 16. The open end 12 of the main body 11 is also threaded and adapted to be closed by complementary threaded end 17 of reference cylinder 18. The reference cylinder 18 may be open at the other end 19 and it has a reference compartment 20 that contains an enclosed reference material 21 which is preferably $KPF_6$. As seen in FIG. 1, a relatively thin wall 22 separates the compartment 13 and the compartment 20 in the assembled rotor 10. The wall 22 which separates the sample and the reference material 21 should be as thin as possible to reduce dead space within the NMR receiver coil. The open end of the reference cylinder 18 is closed with a threaded solid cap 23 to complete the rotor 10. The rotor 10 can be made compatible for use in spectrometers with double air bearings by replacing the finned rotor cap 16 with a threaded solid cap similar to cap 23.

The dimensions of the main body 11 and reference cylinder 18 are chosen so that both the reference material 21 and the sample to be assayed reside within the receiver coil of an NMR apparatus (not shown). Such a design insures a reproducible orientation of both the sample and reference material relative to the receiver coil. All components of the rotor 10 can be manufactured from a plastic material which exhibits the necessary structural strength and does not contribute to the $^{31}P$ spectrum. A suitable inexpensive material is DELRIN, an acetal resin, available from the E. I. du Pont de Nemours & Co., Inc. The novel rotor which isolates the reference material in the reference cylinder 18 also insures that the integrity of the reference material will not be altered by repeated use of the rotor.

In the preferred rotor, the main body 11 of the rotor 10, the finned rotor cap 16, the reference cylinder 18 and the cap 23 are joined by screw threads rather than a pressure-fit because fluid that may leave the sample during high-speed spinning might force apart a pressure-fit joint. However, the novel rotor of the present invention may have other applications in which pressure-fit joints may be acceptable. The rotor of the present invention is readily adapted to all existing external rotor geometries, which permits assays to be performed on all commercial cross polarization, magic angle sample spinning NMR spectrometers including those produced by the Nicolet Instrument Corporation of Madison, Wis. and that described in U.S. Pat. No. 4,254,373.

c. Measurement of $^{31}P$ NMR Spectra

Figure 4:
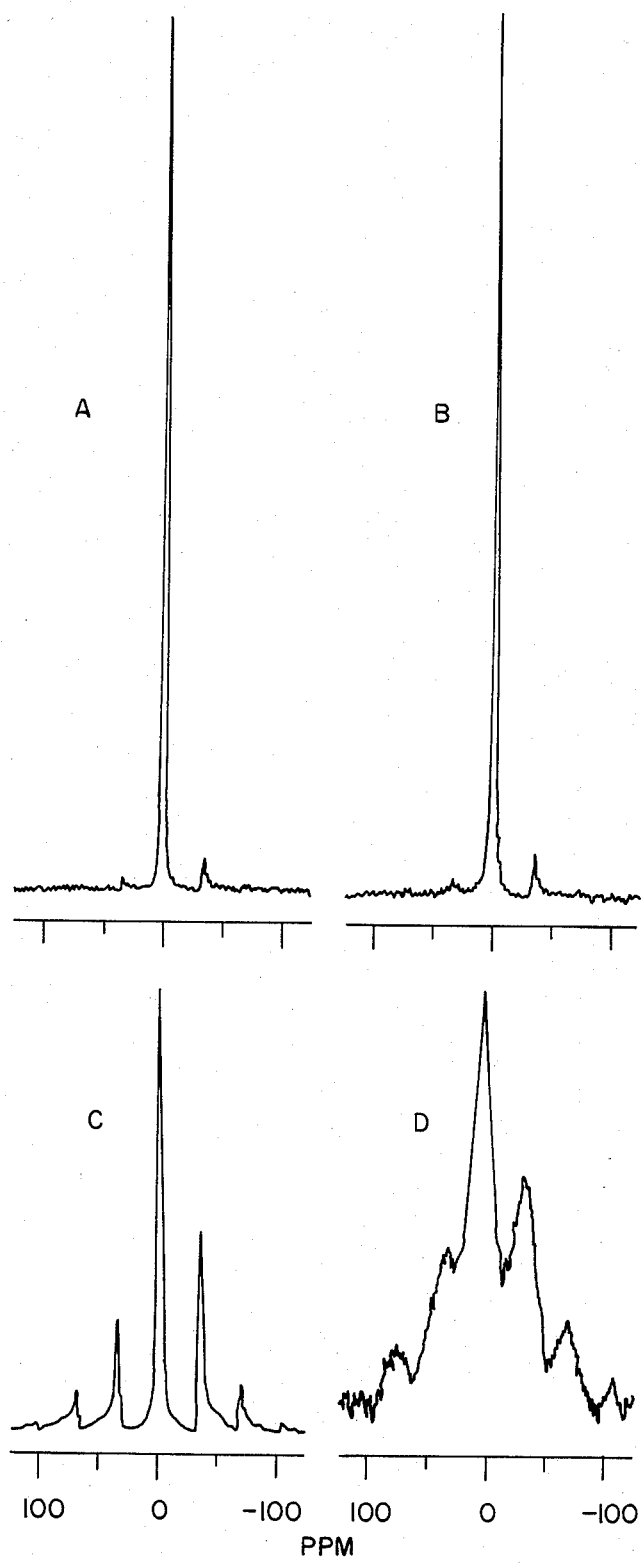
FIG. 4 is magic angle sample spinning $^{31}P$ NMR spectra of (A,B) hydroxyapatite and (C,D) brushite recorded with (A,C) and without (B,D) 200 watts of proton decoupling.

All spectra are recorded with a simple pulse at the resonance frequency of phosphorus followed by acquisition of the resulting free induction decay as a function of time. Fourier transform of the free induction decay yields the frequency-domain spectra of the type in FIGS. 3 and 4. A 60- to 90-degree observe pulse seems best suited for this experiment. Cross polarization need not be used, which reduces both the power requirements of the spectrometer and the possibility of quantitative artifacts.

There are three general populations of phosphate in bone that need to be distinguished. These are (i) the soluble phosphorylated metabolites in cytosol, blood and lymph; (ii) hydroxyapatite, the major mineral constituent of mature bone; and (iii) the protonated phosphate mineral forms such as brushite and octacalcium phosphate, which are believed to be intermediates in mineralization. These are distinguished by varying the magic angle sample spinning and the dipolar proton decoupling.

Since the mineral phosphates will not yield narrow resonances without magic angle sample spinning, whereas the soluble cytosolic phosphates will, one first records the $^{31}P$ NMR spectrum of the bone biopsy sample in a stationary rotor. This spectrum yields the contribution of the soluble phosphorylated metabolites in blood, lymph and cytosol.

Second, the sample rotor is spun at the magic angle at a rate of ca. 1-3 KHz, and the $^{31}P$ NMR spectrum is recorded again with the same spectral parameters as above. This spectrum contains contributions to the isotropic phosphate peak from both hydroxyapatite and soluble phosphates. By subtracting digitally the previous spectrum (i.e. with the rotor stationary), one obtains the spectrum of hydroxyapatite in unfractionated bone. This is the primary mineral component of mature bone (Compare FIGS. 3 and 4A), and its $^{31}P$ NMR spectrum is not affected by proton decoupling (FIG. 4B).

The protonated phosphate minerals exhibit a greater number of spinning sidebands than does hydroxyapatite at moderate spinning speeds, and thus these mineral forms can be detected from their spinning sidebands. However, in the absence of dipolar proton decoupling these spinning sidebands generally are too broad to detect in unfractionated bone because of dipolar coupling to the protons (eg. FIG. 4D). Thus the protonated phosphate minerals are distinguished from hydroxyapatite by yet a third spectrum that is recorded with about 200 watts of proton decoupling to the spinning sample rotor during the observe pulse and acquisition of the free induction decay. If the protonated phosphate minerals are present, they will be detected as additional narrow spinning sidebands about the hydroxyapatite peak when the proton decoupling is turned on (FIG. 4C).

Quantitative measurement of the mineral forms in bone is accomplished by comparing the intensities of the above $^{31}P$ NMR spectra of the bone biopsy sample with those of known mineral reference samples and standardized samples of normal bone. The internal $KPF_6$ reference peak makes this comparison possible. For example, in FIG. 3 digital integration of the peak areas from hydroxyapatite and $KPF_6$ yields the stepped curve. Each step gives the relative area of that peak and is a direct measure of the relative concentrations of $^{31}P$-containing components.

d. Diagnosis of Osteodystrophy

The assay described above provides the identity and quantitative measure of the various mineral forms in unfractionated bone. Diagnosis of osteodystrophy on the basis of these parameters is performed as usual.

It will be readily apparent to those skilled in the art that a number of modifications and changes can be made without departing from the spirit and scope of the present invention. For example, although a rotor has been described in which the finned end cap, the main body, the reference cylinder and the end cap are separate components, it may be desirable in some instances to combine two or more of said components into a single element. Furthermore, although for purposes of illustration, a rotor having a cylindrical outer form has been described, it is to be understood that rotors having a bullet shape or other external shapes may be employed and are intended to be covered. In addition, although a rotor has been shown and described in which the rotor components are secured together by screw threads, other means of securing them together can be used, if desired and acceptable under the circumstances of use. Therefore, it is intended that the invention not be limited except by the claims which follow.

I claim:

1. A rotor for an NMR spectrometer, said rotor having a cone shaped nose portion in a main body portion, said main body portion having a sample compartment for receiving a sample to be analyzed, such as unfractioned bone, a removable cover for the sample container and a reference material compartment, said sample and reference material compartment being positioned end to end along a longitudinal axis and being separated by a wall.

2. A rotor of claim 1, in which the reference material compartment is sealed and contains a reference material.

3. An assay for the mineral content in bone which comprises identifying and quantifying mineral forms in the bone by placing a sample of the bone in a rotor for an NMR spectrometer, which rotor contains a reference material, and then using magic angle sample spinning and dipolar decoupling techniques to record well resolved $^{31}P$ NMR spectra of unfractionated bone biopsy samples and comparing the spectral results for the bone with those of the reference material.

4. The assay of claim 3 in which the reference material is $KPF_6$.

* * * * *